United States Patent [19]
Ovens et al.

[11] Patent Number: 5,250,852
[45] Date of Patent: Oct. 5, 1993

[54] CIRCUITRY AND METHOD FOR LATCHING A LOGIC STATE

[75] Inventors: Kevin M. Ovens, Plano; Clive D. Bittlestone, Allen, both of Tex.

[73] Assignee: Texas Instruments Incorporated, Dallas, Tex.

[21] Appl. No.: 988,395

[22] Filed: Dec. 9, 1992

Related U.S. Application Data

[63] Continuation of Ser. No. 869,591, Apr. 16, 1992, abandoned.

[51] Int. Cl.$^5$ .................... H03K 17/56; H03K 3/289
[52] U.S. Cl. .................. 307/272.2; 307/279; 307/242; 307/481; 307/353; 377/75; 377/79
[58] Field of Search ................ 377/75, 78-79; 307/272.1-272.2, 279, 242, 481, 353

[56] References Cited

U.S. PATENT DOCUMENTS 4,066,919  1/1978  Huntington .................. 307/353
4,495,629  1/1985  Zasio et al. .................. 377/70
5,132,993  7/1992  Nishiura et al. .................. 377/79

FOREIGN PATENT DOCUMENTS 3443788  6/1986  Fed. Rep. of Germany ... 307/272.2
0206717  8/1989  Japan .................. 307/272.2

Primary Examiner—Margaret R. Wambach
Attorney, Agent, or Firm—Wade James Brady, III; B. Peter Barndt; Richard L. Donaldson

[57] ABSTRACT

A method and circuitry are provided for latching a logic state. A first signal (64) indicates a logic state of an input signal (D) in response to a first transition of a clock signal (72). A second signal (68) indicates a logic state of the first signal (64) in response to a second transition of the clock signal (72). An output signal (Q) indicates the logic state of the first signal (64) in response to the second transition and indicates a logic state of the second signal (68) in response to the first transition.

33 Claims, 2 Drawing Sheets

CIRCUITRY AND METHOD FOR LATCHING A LOGIC STATE

This application is a continuation of application Ser. No. 07/869,591, filed Apr. 16, 1992, now abandoned.

TECHNICAL FIELD OF THE INVENTION

This invention relates in general to electronic circuitry, and in particular to a method and circuitry for latching a logic state.

BACKGROUND OF THE INVENTION

A clocked flip-flop is a sequential circuit for selectively latching the binary logic states zero and one. A D flip-flop inputs a binary data input D and outputs a binary data output Q. In response to an active edge of a clock signal, Q assumes a logic state equal to an earlier logic state of D. If the logic state of D later changes, then Q assumes a logic state equal to the changed logic state of D, only in response to a subsequent active edge of the clock signal.

Relative to previous techniques, it is desirable to reduce the necessary "clock-to-Q" time for Q to assume a logic state equal to an earlier logic state of D, in response to an active edge of the clock signal. Also, it is desirable to increase the highest frequency $F_{max}$ at which repeated active edges of the clock signal may occur without significantly degrading the ability of Q to accurately assume logic states equal to those of D. Moreover, it is desirable to reduce the layout area occupied by such a flip-flop on an integrated circuit. By reducing the layout area, through current in switching is reduced, and internal node capacitances are reduced, such that average power consumption is reduced.

Thus, a need has arisen for a method and circuitry for latching a logic state, in which clock-to-Q time is reduced, $F_{max}$ is increased, layout area is reduced, and power consumption is reduced.

SUMMARY OF THE INVENTION

In a method and circuitry for latching a logic state, a first signal indicates a logic state of an input signal in response to a first transition of a clock signal. A second signal indicates a logic state of the first signal in response to a second transition of the clock signal. An output signal indicates the logic state of the first signal in response to the second transition and indicates a logic state of the second signal in response to the first transition.

It is a technical advantage of the present invention that clock-to-Q time is reduced.

It is another technical advantage of the present invention that $F_{max}$ is increased.

It is a further technical advantage of the present invention that layout area is reduced.

It is yet another technical advantage of the present invention that power consumption is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–6 of the drawings, like numerals being used for like and corresponding parts of the various drawings.

Figure 1:
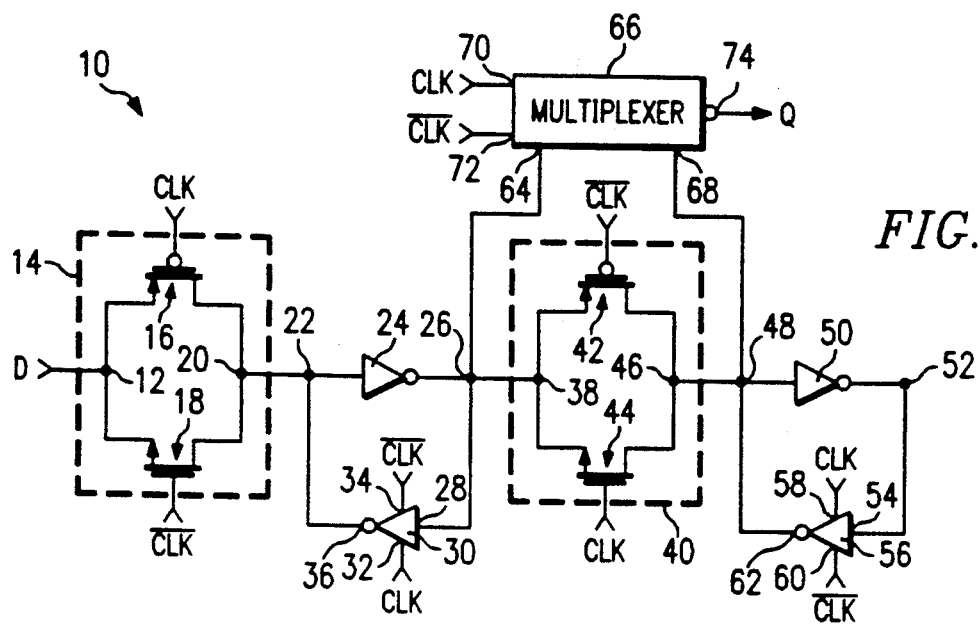
FIG. 1 is a schematic electrical circuit diagram of a first exemplary embodiment of a flip-flop according to the present invention.

FIG. 1 is a schematic electrical circuit diagram of a first exemplary embodiment of a flip-flop indicated generally at 10. A binary data input D is connected to an input node 12 of a transfer gate indicated by dashed enclosure 14. Input node 12 is connected to a source of a p-channel field effect transistor 16, and to a source of an n-channel field effect transistor 18. An output node 20 of transfer gate 14 is connected to a drain of transistor 16 and to a drain of transistor 18. A gate of transistor 16 is connected to a clock signal line CLK, and a gate of transistor 18 is connected to an inverted clock signal line $\overline{\text{CLK}}$.

Output node 20 of transfer gate 14 is coupled through a node 22 to an input of a CMOS inverter 24. An output of CMOS inverter 24 is coupled through a node 26 to a data input 28 of a gated CMOS inverter 30. A first clock input 32 of gated inverter 30 is connected to CLK, and a second clock input 34 of gated inverter 30 is connected to $\overline{\text{CLK}}$. A data output 36 of gated inverter 30 is connected to node 22.

Node 26 is further connected to an input node 38 of a transfer gate indicated by dashed enclosure 40. Input node 38 is connected to a source of a p-channel field effect transistor 42, and to a source of an n-channel field effect transistor 44. An output node 46 of transfer gate 40 is connected to a drain of transistor 42 and to a drain of transistor 44. A gate of transistor 42 is connected to $\overline{\text{CLK}}$, and a gate of transistor 44 is connected to CLK.

Output node 46 of transfer gate 40 is coupled through a node 48 to an input of a CMOS inverter 50. An output of CMOS inverter 50 is coupled through a node 52 to a data input 54 of a gated CMOS inverter 56. A first clock input 58 of gated inverter 56 is connected to CLK, and a second clock input 60 of gated inverter 56 is connected to $\overline{\text{CLK}}$. A data output 62 of gated inverter 56 is connected to node 48.

In the first exemplary embodiment of flip-flop 10 shown in FIG. 1, a first data input 64 of a multiplexer 66 is connected to node 26, and a second data input 68 of multiplexer 66 is connected to node 48. A first clock input 70 of multiplexer 66 is connected to CLK, and a second clock input 72 of multiplexer 66 is connected to $\overline{\text{CLK}}$. An output 74 of multiplexer 66 is connected to a binary data output Q.

Figure 2:
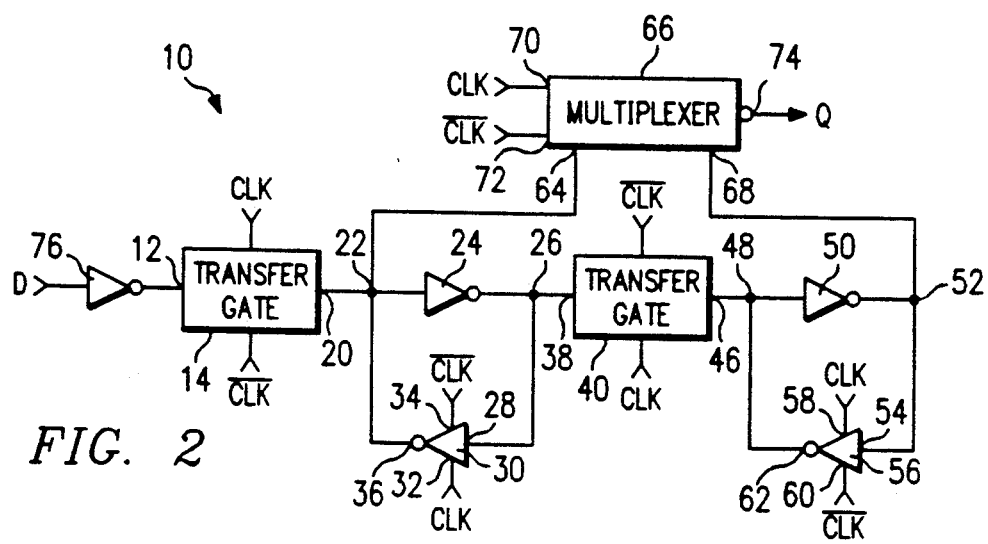
FIG. 2 is a schematic electrical circuit diagram of a second exemplary embodiment of a flip-flop according to the present invention.

FIG. 2 is a schematic electrical circuit diagram of a second exemplary embodiment of flip-flop 10. Flip-flop 10 as shown in FIG. 2 is modified relative to FIG. 1, in that data input 64 of multiplexer 66 is connected to node 22 instead of node 26, data input 68 of multiplexer 66 is connected to node 52 instead of node 48, and D is coupled through a CMOS inverter 76 to input node 12 of transfer gate 14. As shown in FIG. 2, it is preferable to use both inverter 50 and multiplexer 66 to provide Q, rather than using node 48 to directly provide Q. If node 48 was used to directly provide Q, then an external load connected to Q would undesirably increase latching time for back-to-back inverters 50 and 56.

In the preferred embodiment, transistor 16 has a channel length of approximately 1 micrometer and a channel width of approximately 10 micrometers, transistor 18 has a channel length of approximately 1 micrometer and a channel width of approximately 8.5 micrometers, transistor 42 has a channel length of approximately 1 micrometer and a channel width of approximately 3 micrometers, and transistor 44 has a channel length of approximately 1 micrometer and a channel width of approximately 3 micrometers.

With reference to both FIGS. 1 and 2, in response to a positive edge transition of $\overline{CLK}$ and a corresponding negative edge transition of CLK, transfer gate 14 closes and gated inverter 30 opens. Accordingly, node 22 quickly assumes a logic state equal to that of input node 12, and node 26 quickly assumes a logic state inverted from that of input node 12. In this manner, nodes 22 and 26 each indicate a logic state of input node 12 in response to a positive edge transition of $\overline{CLK}$. Further, in response to the positive edge transition of $\overline{CLK}$, transfer gate 40 opens and gated inverter 56 closes, such that logic states of nodes 48 and 52 are latched by back-to-back inverters 50 and 56. Moreover, output 74 assumes a logic state inverted from that of second data input 68.

In response to a negative edge transition of $\overline{CLK}$ and a corresponding positive edge transition of CLK, transfer gate 14 opens and gated inverter 30 closes, such that logic states of nodes 22 and 26 are latched by back-to-back inverters 24 and 30. Further, transfer gate 40 closes and gated inverter 56 opens. Accordingly, node 48 quickly assumes a logic state equal to that of node 26, and node 52 quickly assumes a logic state inverted from that of node 26. Moreover, output 74 assumes a logic state inverted from that of first data input 64.

With specific reference to flip-flop 10 as shown in FIG. 1, a positive edge transition of $\overline{CLK}$ results in a logic state of node 48 being latched, in Q assuming a logic state inverted from that of node 48, and in node 26 quickly assuming a logic state inverted from that of D.

In response to a subsequent negative edge transition of $\overline{CLK}$, a logic state of node 26 is latched, Q assumes a logic state inverted from that of node 26, and node 48 assumes a logic state equal to that of node 26. Since node 26 earlier assumed a logic state inverted from that of D in response to the preceding positive edge transition of $\overline{CLK}$, the logic state assumed by Q equals the earlier logic state of D.

In response to a subsequent positive edge transition of $\overline{CLK}$, a logic state of node 48 is latched, Q assumes a logic state inverted from that of node 48, and node 26 quickly assumes a logic state equal to that of D. Since node 48 earlier assumed a logic state equal to that of node 26 in response to the preceding negative edge transition of $\overline{CLK}$, and since Q earlier assumed a logic state inverted from that of node 26 in response to the preceding negative edge of $\overline{CLK}$, the logic state assumed by Q is unchanged from the earlier logic state that Q assumed in response to the preceding negative edge transition of $\overline{CLK}$.

By including multiplexer 66 connected to node 26 in FIG. 1, Q assumes a logic state inverted from that of node 26 in response to a negative edge transition of $\overline{CLK}$. This delay is typically faster than the delay of transfer gate 40. Relative to previous techniques, flip-flop 10 as shown in FIG. 1 advantageously reduces clock-to-Q time, because the only clock-to-Q delay is between a negative edge transition of $\overline{CLK}$ and the assumption by Q of a logic state inverted from that of node 26.

Without multiplexer 66 connected to node 26 in FIG. 1, the clock-to-Q time would be a delay between a negative edge transition of $\overline{CLK}$ and the assumption by Q of a logic state inverted from that of node 48. Accordingly, without multiplexer 66 connected to node 26, the clock-to-Q time would typically be a delay for transfer gate 40 to close, for a signal to propagate from node 26 through transfer gate 40 to node 48, and for a signal to propagate from node 48 through a CMOS inverter. Thus, without multiplexer 66 connected to node 26, clock-to-Q time would be slower unless the drive capabilities of inverter 24, transfer gate 40 and gated inverter 56 were increased. If such drive capabilities were increased, then layout area and power would undesirably increase. Comparatively, in flip-flop 10 as shown in FIG. 1, clock-to-Q delay primarily depends upon the drive capabilities of only inverter 24 and multiplexer 66.

Flip-flop 10 as shown in FIG. 2 achieves similar clock-to-Q advantages as in FIG. 1. By including multiplexer 66 connected to node 22 in FIG. 2, Q assumes a logic state inverted from that of node 22 in response to a negative edge transition of $\overline{CLK}$. This delay is typically faster than the delay of transfer gate 40. Relative to previous techniques, flip-flop 10 as shown in FIG. 2 advantageously reduces clock-to-Q time, because the only clock-to-Q delay is between a negative edge transition of $\overline{CLK}$ and the assumption by Q of a logic state inverted from that of node 22.

Without multiplexer 66 connected to node 22 in FIG. 2, the clock-to-Q time would be a delay between a negative edge transition of $\overline{CLK}$ and the assumption by Q of a logic state inverted from that of node 52. Accordingly, without multiplexer 66 connected to node 22, the clock-to-Q time would typically be a delay for transfer gate 40 to close, for a signal to propagate from node 26 through transfer gate 40 to node 48, and for a signal to propagate from node 48 through inverter 50 and then through another CMOS inverter (not shown). Thus, without multiplexer 66 connected to node 22, clock-to-Q time would be slower unless the drive capabilities of inverter 24, transfer gate 40 and inverter 50 were increased. If such drive capabilities were increased, then layout area and power would undesirably increase. Comparatively, in flip-flop 10 as shown in FIG. 2, clock-to-Q delay primarily depends upon the drive capability and switching time of multiplexer 66.

In flip-flop 10 as shown in FIG. 1, if D was coupled through a CMOS inverter to input node 12 of transfer gate 14, then output 74 of multiplexer 66 would provide an inverted binary data output $\overline{Q}$. Similarly, in flip-flop 10 as shown in FIG. 2, if D was coupled directly to input node 12 of transfer gate 14 without CMOS inverter 76, then output 74 of multiplexer 66 would provide an inverted binary data output $\overline{Q}$.

For providing non-inverted binary data output Q, flip-flop 10 as shown in FIG. 1 advantageously occupies less layout area than in FIG. 2, because flip-flop 10 as shown in FIG. 1 does not include inverter 76. Nevertheless, inverter 76 of FIG. 2 provides additional signal drive through transfer gate 14 to node 22, advantageously reducing the minimum setup time before an active negative edge transition of $\overline{CLK}$. Moreover, in flip-flop 10 as shown in FIG. 2, data input 68 of multiplexer 66 is advantageously driven by non-gated inverter 50, whereas in FIG. 1 data input 68 is less desirably driven by gated inverter 56.

Figure 3A:
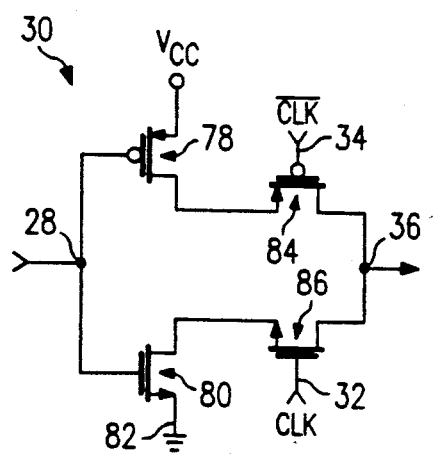
FIG. 3a is a schematic electrical circuit diagram of a first gated inverter of the flip-flops of FIGS. 1 and 2.

FIG. 3a is a schematic electrical circuit diagram of gated inverter 30 of flip-flop 10. Data input 28 is connected to a gate of a p-channel field effect transistor 78, and to a gate of an n-channel field effect transistor 80. A source of transistor 78 is connected to a voltage supply node $V_{cc}$, and a source of transistor 80 is connected to a voltage reference node 82. In the preferred embodiment, a voltage at $V_{cc}$ is approximately five volts relative to a voltage at voltage reference node 82. A drain of transistor 78 is connected to a source of a p-channel field effect transistor 84, and a drain of transistor 80 is connected to a source of an n-channel field effect transistor 86. A gate of transistor 84 is coupled through clock input 34 to $\overline{CLK}$, and a gate of transistor 86 is coupled through clock input 32 to CLK. Data output 36 is connected to a drain of transistor 84, and to a drain of transistor 86.

Figure 3B:
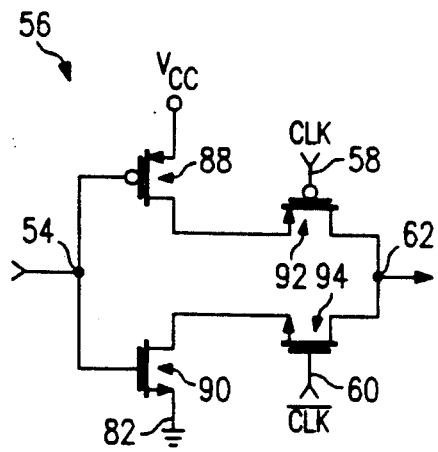
FIG. 3b is a schematic electrical circuit diagram of a second gated inverter of the flip-flops of FIGS. 1 and 2.

FIG. 3b is a schematic electrical circuit diagram of gated inverter 56 of flip-flop 10. Data input 54 is connected to a gate of a p-channel field effect transistor 88, and to a gate of an n-channel field effect transistor 90. A source of transistor 88 is connected to $V_{cc}$, and a source of transistor 90 is connected to voltage reference node 82. A drain of transistor 88 is connected to a source of a p-channel field effect transistor 92, and a drain of transistor 90 is connected to a source of an n-channel field effect transistor 94. A gate of transistor 92 is coupled through clock input 58 to CLK, and a gate of transistor 94 is coupled through clock input 60 to $\overline{CLK}$. Data output 62 is connected to a drain of transistor 92, and to a drain of transistor 94.

In the preferred embodiment, each of transistors 78, 80, 84, 86, 88, 90, 92 and 94 of FIGS. 3a-b, has a channel length of approximately one micrometer and a channel width of approximately three micrometers.

Figure 4:
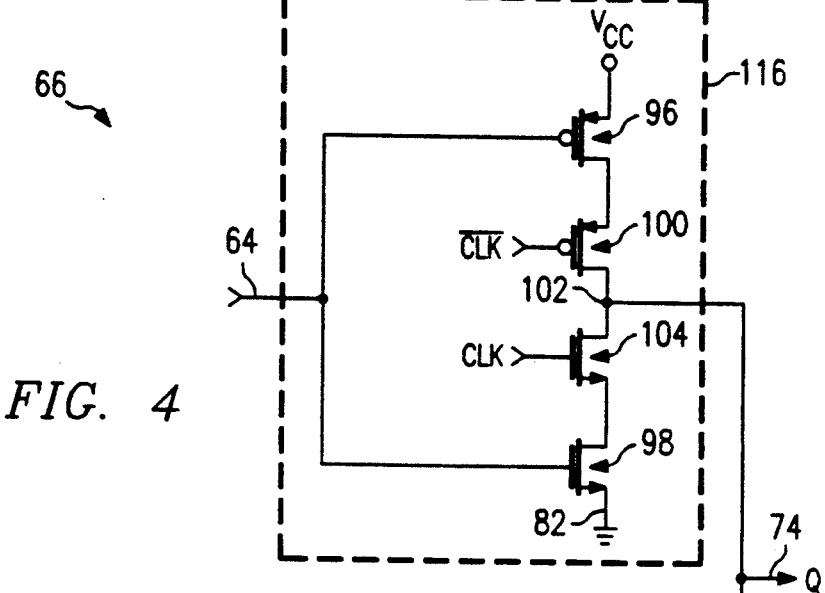
FIG. 4 is a schematic electrical circuit diagram of a multiplexer of the flip-flops of FIGS. 1 and 2.

FIG. 4 is a schematic electrical circuit diagram of multiplexer 66 of flip-flop 10. Data input 64 is connected to a gate of a p-channel field effect transistor 96, and to a gate of an n-channel field effect transistor 98. A source of transistor 96 is connected to $V_{cc}$, and a source of transistor 98 is coupled to voltage reference node 82. A drain of transistor 96 is connected to a source of a p-channel field effect transistor 100. A gate of transistor 100 is connected to $\overline{CLK}$. A drain of transistor 100 is connected to a node 102. A drain of transistor 98 is connected to a source of an n-channel field effect transistor 104. A gate of transistor 104 is connected to CLK. A drain of transistor 104 is connected to node 102.

Data input 68 is connected to a gate of a p-channel field effect transistor 106, and to a gate of an n-channel field effect transistor 108. A source of transistor 106 is connected to $V_{cc}$, and a source of transistor 108 is connected to voltage reference node 82. A drain of transistor 106 is connected to a source of a p-channel field effect transistor 110. A gate of transistor 110 is connected to CLK. A drain of transistor 110 is connected to a node 112. A drain of transistor 108 is connected to a source of an n-channel field effect transistor 114. A gate of transistor 114 is connected to $\overline{CLK}$. A drain of transistor 114 is connected to node 112.

Output 74 is connected to node 102 and to node 112. Transistors 96, 98, 100 and 104 together form a driver section indicated by dashed enclosure 116. Transistors 106, 108, 110 and 114 together form a holder section indicated by dashed enclosure 118.

In the preferred embodiment, each of transistors 96 and 100 has a channel length of approximately 1 10 micrometer and a channel width of approximately 32.25 micrometers. Each of transistors 98 and 104 has a channel length of approximately 1 micrometer and a channel width of approximately 15.25 micrometers. Each of transistors 106 and 110 has a channel length of approximately 1 micrometer and a channel width of approximately 3 micrometers. Each of transistors 108 and 114 has a channel length of approximately 1 micrometer and a channel width of approximately 2.5 micrometers.

In response to a positive edge transition of $\overline{CLK}$, and a corresponding negative edge transition of CLK, transistors 100 and 104 of driver section 116 are substantially turned off, and transistors 110 and 114 of holder section 118 are substantially turned on, such that output 74 assumes a logic state inverted from that of data input 68. In response to a negative edge transition of $\overline{CLK}$ and a corresponding positive edge transition of CLK, transistors 100 and 104 of driver section 116 are substantially turned on, and transistors 110 and 114 of holder section 118 are substantially turned off, such that output 74 assumes a logic state inverted from that of data input 64.

As described further hereinabove in connection with FIGS. 1 and 2, in response to a positive edge transition of $\overline{CLK}$, the logic state assumed by Q is unchanged from the earlier logic state that Q assumed in response to the preceding negative edge transition of $\overline{CLK}$. Accordingly, the clock-to-Q delay is between a negative edge transition of $\overline{CLK}$ and the assumption by Q of a logic state inverted from that of data input 64. In order to reduce clock-to-Q time, the drive capability of driver section 116 is increased, such that the transistors of driver section 116 are substantially larger than the transistors of holder section 118.

It should be noted that the large drive capability of driver section 11 might slow latching by back-to-back inverters 24 and 30 of FIGS. 1 and 2. A slower latching would increase the minimum hold time after an active negative edge transition of $\overline{CLK}$. In the preferred embodiment, the possibility of increased hold time is addressed by suitably establishing a sufficiently large drive strength of transfer gate 14, such that transistors 16 and 18 of transfer gate 14 have channel widths as set forth hereinabove in connection with FIGS. 1 and 2. The resulting size of transfer gate 14 is not larger than a typical input transfer gate of previous techniques.

Figure 5:
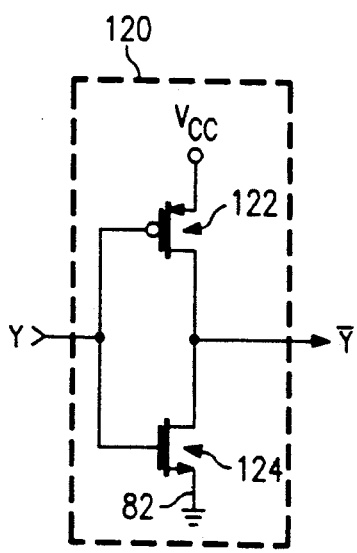
FIG. 5 is a schematic electrical circuit diagram of a CMOS inverter.

FIG. 5 is a schematic electrical circuit diagram of a CMOS inverter indicated by dashed enclosure 120, having an input Y and an output $\overline{Y}$. A logic state of $\overline{Y}$ is inverted from that of Y. Y is connected to a gate of a p-channel field effect transistor 122, and to a gate of an n-channel field effect transistor 124. A source of transistor 122 is connected to $V_{cc}$, and a source of transistor 124 is connected to voltage reference node 82. $\overline{Y}$ is connected to a drain of transistor 122, and to a drain of transistor 124.

Figure 6:
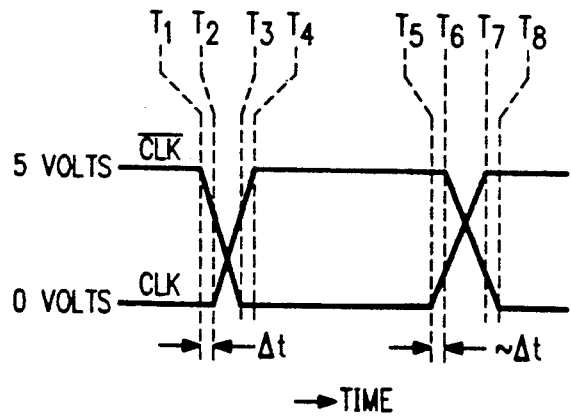
FIG. 6 is a timing diagram of the inverter of FIG. 5.

In an exemplary embodiment, inverter 120 inputs $\overline{CLK}$ (Y=$\overline{CLK}$) and outputs CLK ($\overline{Y}$=CLK) in response thereto. FIG. 6 is a timing diagram of inverter 120 when CLK is output in response to $\overline{CLK}$. As shown in FIG. 6, a negative edge transition of $\overline{CLK}$ from a high logic state of approximately 5 volts to a low logic state of approximately 0 volts occurs between a time $T_1$ and a time $T_3$. In response to the negative edge transition of $\overline{CLK}$, a positive edge transition of CLK from 0 volts to 5 volts occurs between a time $T_2$ and a time $T_4$. $T_2$ and $T_4$ are delayed from $T_1$ and $T_3$, such that:

$$T_2 - T_1 = \Delta t.$$

Similarly, a positive edge transition of $\overline{CLK}$ occurs between a time $T_5$ and a time $T_7$. In response to the positive edge transition of $\overline{CLK}$, a negative edge transition of CLK occurs between a time $T_6$ and a time $T_8$. $T_6$ and $T_8$ are delayed from $T_5$ and $T_7$, such that:

$$T_6 - T_5 = \Delta t.$$

Preferably, $\overline{CLK}$ has a fifty percent duty cycle, such that the time during which $\overline{CLK}$ is high (approximately 5 volts) is approximately equal to the time during which $\overline{CLK}$ is low (approximately zero volts). Where Y equals $\overline{CLK}$ and $\overline{Y}$ equals CLK, it is preferable for transistor 122 to have a channel length of approximately one micrometer and a channel width of approximately 19 micrometers. It is further preferable for transistor 124 to have a channel length of approximately one micrometer and a channel of approximately 5.5 micrometers.

The difference in channel widths between transistors 122 and 124 results in a high threshold voltage of inverter 120, so that a difference between $T_4$ and $T_2$ (time for a positive edge transition of CLK) is less than a difference between $T_8$ and $T_6$ (time for a negative edge transition of CLK) to optimize the clock-to-Q delay when a logic state of Q changes from high to low. If the difference between $T_4$ and $T_2$, or the difference between $T_8$ and $T_6$, is greater than approximately three to four nanoseconds, then a transparency problem might arise where both transfer gates 14 and 40 (FIGS. 1 and 2) are momentarily closed at the same time, such that a low impedance path is undesirably formed between D and data input 68.

As described further hereinabove in connection with FIGS. 1 and 2, in response to a positive edge transition of $\overline{CLK}$, the logic state assumed by output 74 of multiplexer 66 is unchanged from the earlier logic state that output 74 assumed in response to the preceding negative edge transition of $\overline{CLK}$. It should be noted that if $\overline{CLK}$ and CLK are skewed by $\Delta t$ as shown in FIG. 6, then a glitch might occur at output 74 in response to a positive edge transition of $\overline{CLK}$.

For example, if data input 64 has a logic state of zero (approximately 0 volts) immediately prior to $T_5$, then output 74 has a logic state of one (approximately 5 volts) immediately prior to $T_5$. Moreover, data input 68 has a logic state of zero immediately prior to $T_5$. After $T_5$, transistor 114 substantially turns on and transistor 100 substantially turns off in response to the positive edge transition of $\overline{CLK}$. Further after $T_5$, transistor 110 substantially turns on and transistor 104 substantially turns off in response to the negative edge transition of CLK. Accordingly, output 74 continues having a logic state of one after $T_5$. However, since CLK is delayed by $\Delta t$ from $\overline{CLK}$, it is possible that a logic state of data input 64 might change from zero to one before transistor 104 substantially turns off. In such a situation, both transistors 104 and 98 would momentarily be turned on at the same time, resulting in a negative glitch at output 74 before transistor 104 eventually turns off. Nevertheless, after any such glitch, output 74 would correctly have a logic state of one, because data input 68 would have a logic state of zero and both transistors 100 and 114 would be turned on.

Further, a positive glitch might occur after a negative edge transition of $\overline{CLK}$ if a logic state of data input 68 changes from one to zero before transistor 110 substantially turns off. Nevertheless, in that situation, the positive glitch would be consistent with the desired logic state at output 74 because data input 68 would have a logic state equal to that of data input 64.

A glitch in response to a positive edge transition of $\overline{CLK}$ is less likely for flip-flop 10 as shown in FIG. 1, because inverter 24 delays a change in the logic state of data input 64 after a positive edge transition of $\overline{CLK}$. For flip-flop 10 as shown in either FIG. 1 or FIG. 2, the chance of such a glitch could be further diminished by reducing the size and drive strength of transfer gate 14, so that a change in logic state of data input 64 would be delayed. A shortcoming of such an approach is that setup time before a negative edge transition of $\overline{CLK}$ would increase and accordingly reduce $F_{max}$.

In another approach to diminishing the chance of a glitch at output 74, the sizes of transistors in holder section 118 (FIG. 4) could be increased in order to maintain output 74 at a logic state of one, despite a momentary low impedance path through transistors 104 and 98 of driver section 116. A shortcoming of this approach is that additional layout area would be occupied by holder section 118. Alternatively, if the sizes of transistors in driver section 116 were decreased in order to diminish the magnitude of a glitch at output 74, then clock-to-Q time would undesirably increase.

In yet another approach to diminishing the chance of a glitch at output 74, the transistor sizes of driver section 116 could be suitably established to raise the threshold voltage of transistor 104, so that transistor 104 would substantially turn off more quickly at a higher voltage of CLK. A shortcoming of this approach is that transistor 104 would require more time to substantially turn on in response to an active negative edge transition of $\overline{CLK}$, thereby increasing clock-to-Q time where the logic state of output 74 changes from a one to a zero.

In still another approach to diminishing the chance of a glitch at output 74, the difference in channel widths between transistors 122 and 124 (FIG. 5) could be reduced, so that the difference between $T_4$ and $T_2$ would be greater than the difference between $T_8$ and $T_6$. By reducing the difference between $T_8$ and $T_6$, the chance of a glitch at output 74 would be diminished because transistor 104 (FIG. 4) would substantially turn off more quickly. However, by increasing the difference between $T_4$ and $T_2$, clock-to-Q time would be undesirably delayed where data input 64 has a logic state of one.

The chance of a glitch at output 74 can be diminished by a combination of the above-described approaches in consideration of the various trade-offs and needs of a particular situation. In the preferred embodiment, the chance of a glitch is diminished by suitably establishing the transistor sizes of driver section 116 so that transistor 104 substantially turns off more quickly at a higher voltage of CLK, and by suitably establishing a sufficiently small drive strength of transfer gate 14 so that a change in the logic state of data input 54 is delayed.

Moreover, in the preferred embodiment, an increased capacitive load is connected to output 74, such that the magnitude of a possible glitch at output 74 is diminished. For an output load of one Bi-CMOS gate having a 0.8 micrometer channel length, flip-flop 10 as shown in FIG. 2 achieves a $F_{max}$ of approximately 1.15 gigahertz, which is significantly improved over previous techniques.

Even if CLK is not delayed from $\overline{CLK}$, a glitch is possible due to differences in switching durations between n-channel and p-channel field effect transistors. This problem is straightforwardly addressed by suitably establishing channel widths of the p-channel and n-channel field effect transistors.

In the preferred embodiment, CMOS inverters 24, 50 and 76 are identical in design to inverter 120 of FIG. 5, except that the p-channel transistor of inverter 76 has a channel width of approximately 9.5 micrometers, the n-channel transistor of inverter 76 has a channel width of approximately five micrometers, and each transistor of inverters 24 and 50 has a channel width of approximately three micrometers. Significantly, each transistor of inverters 24 and 50, gated inverters 30 and 56, and transfer gate 40 has a channel length of approximately one micrometer and a channel width of approximately three micrometers, such that flip-flop 10 occupies significantly less layout area than typical previous techniques. The relatively small sizes of inverters 24 and 50, gated inverters 30 and 56, and transfer gate 40 are possible because flip-flop 10 reduces clock-to-Q delay by including multiplexer 66 rather than by increasing the sizes of inverters 24 and 50, gated inverters 30 and 56, and transfer gate 40. Comparatively, in typical previous techniques, each p-channel transistor might have a channel width of approximately 18 micrometers, and each n-channel transistor might have a channel width of approximately 10 micrometers. Thus, even considering the layout area added to flip-flop 10 by including multiplexer 66, flip-flop 10 occupies significantly less layout area than typical previous techniques.

With negligible delay between $\overline{CLK}$ and CLK, flip-flop 10 achieves a clock-to-Q time of approximately 100 picoseconds primarily resulting from a signal delay through multiplexer 66. With a significant delay between $\overline{CLK}$ and CLK as described further hereinabove in connection with FIGS. 5 and 6, where Δt is approximately 200 picoseconds, flip-flop 10 achieves a clock-to-Q time on the order of 200 picoseconds primarily resulting from the delay between $\overline{CLK}$ and CLK. The clock-to-Q times achieved by flip-flop 10 of the preferred embodiment are substantially improved relative to previous techniques that have clock-to-Q times on the order of 1.5 nanoseconds. In the preferred embodiment, clock-to-Q time is approximately the same when a logic state of output 74 changes from one to zero as when a logic state of output 74 changes from zero to one.

In an alternative embodiment, nodes previously connected to CLK are instead connected to $\overline{CLK}$, and nodes previously connected to $\overline{CLK}$ are instead connected to CLK. According to such an alternative embodiment, the active edge of flip-flop 10 would be a positive edge transition of $\overline{CLK}$ instead of a negative edge transition of $\overline{CLK}$. If CLK is delayed from $\overline{CLK}$, then the clock-to-Q time would be significantly shorter when a logic state of output 74 changed from one to zero than from zero to one, because the earlier-in-time transition of $\overline{CLK}$ would switch the relatively strong n-channel transistor 104 more quickly than a transition of CLK would switch p-channel transistor 100. Also, in such an alternative embodiment, a positive glitch is possible, resulting from transistors 96 and 100 temporarily being turned at the same time after a negative edge transition of $\overline{CLK}$.

In yet another alternative embodiment, each of gated inverters 30 and 56 is replaced by a CMOS inverter in series with a transfer gate, such that sources of transistors 84 and 86 are connected, and such that sources of transistors 92 and 94 are connected.

In still another alternative embodiment, gated inverters 30 and 56 are replaced by non-gated CMOS inverters. In such an alternative embodiment, setup time (after a positive edge transition of $\overline{CLK}$) would increase. In still another alternative embodiment, multiplexer 66 is replaced by functionally equivalent multiplexing circuitry having a structure different from that shown in FIG. 4.

In an even further alternative embodiment, CLK is independent of $\overline{CLK}$, such that flip-flop 10 can be made transparent by simultaneously holding both CLK and $\overline{CLK}$ in a low logic state, thereby closing transfer gates 14 and 40. Such transparency is advantageous for initializing a series of multiple flip-flops in a shift register, scan chain, or similar configuration. After such an initialization, normal operation of flip-flop 10 can be resumed by making $\overline{CLK}$ inverted from CLK.

Although the present invention and its advantages have been described in detail, it should be understood that various changes, substitutions and alterations can be made herein without departing from the spirit and scope of the invention as defined by the appended claims.

What is claimed is:

1. Circuitry for latching a logic state, comprising:
   an input node for inputting an input signal;
   first transfer circuitry coupled to said input node for outputting a first signal indicating a logic state of said input signal in response to a first transition of a clock signal;
   second transfer circuitry coupled to said first transfer circuitry for outputting a second signal indicating a logic state of said first signal in response to a second transition of said clock signal; and
   multiplexing circuitry coupled to said first and second transfer circuitry for outputting an output signal indicating said logic state of said first signal in response to said second transition and indicating a logic state of said second signal in response to said first transition.

2. The circuitry of claim 1 and including latching circuitry coupled to said first transfer circuitry for latching said first signal.

3. The circuitry of claim 2 wherein said latching circuitry latches said first signal in response to said second transition.

4. The circuitry of claim 1 and including latching circuitry coupled said second transfer circuitry for latching said second signal.

5. The circuitry of claim 4 wherein said latching circuitry latches said second signal in response to said first transition.

6. The circuitry of claim 1 wherein said second transfer circuitry outputs said second signal indicating said logic state of said first signal by outputting said second signal having a logic state inverted from that of said first signal.

7. The circuitry of claim 1 wherein said first transfer circuitry outputs said first signal indicating said logic state of said input signal by outputting said first signal having a logic state equal to that of said input signal.

8. The circuitry of claim 1 wherein said first transfer circuitry is coupled through an inverter to said input node, and wherein said first transfer circuitry outputs said first signal indicating said logic state of said input signal by outputting said first signal having a logic state inverted from that of said input signal.

9. The circuitry of claim 1 wherein said multiplexing circuitry includes:
   a driver section for controlling said output signal to indicate said logic state of said first signal in response to said second transition; and
   a holder section for controlling said output signal to indicate said logic state of said second signal in response to said first transition.

10. The circuitry of claim 9 wherein said driver section controls said output signal to indicate said logic state of said first signal by controlling said output signal to have a logic state inverted from that of said first signal.

11. The circuitry of claim 9 wherein said holder section controls said output signal to indicate said logic state of said second signal by controlling said output signal to have a logic state inverted from that of said second signal.

12. The circuitry of claim 1 wherein said first transition of said clock signal is opposite in direction from said second transition of said clock signal.

13. Circuitry for latching a logic state, comprising:
   an input node for inputting an input signal;
   clock circuitry for outputting a clock signal;
   a first transfer gate coupled to said input node and to said clock circuitry for outputting a first signal indicating a logic state of said input signal in response to a first transition of said clock signal;
   a first latch coupled to said first transfer gate for latching said first signal;
   a second transfer gate coupled to said first latch and to said clock circuitry for outputting a second signal indicating a logic state of said first signal in response to a second transition of said clock signal;
   a second latch coupled to said second transfer gate for latching said second signal; and
   a multiplexer coupled to said first and second latches and to said clock circuitry for outputting an output signal indicating said logic state of said first signal in response to said second transition and indicating a logic state of said second signal in response to said first transition.

14. The circuitry of claim 13 wherein said first latch includes first and second inverters, an input of said first inverter being coupled to said transfer gate, an output of said first inverter being coupled to an input of said second inverter, and an output of said second inverter being coupled to said input of said first inverter.

15. The circuitry of claim 14 wherein said multiplexer is coupled to said first latch by being coupled to said input of said first inverter.

16. The circuitry of claim 14 wherein said multiplexer is coupled to said first latch by being coupled to said output of said first inverter.

17. The circuitry of claim 14 wherein said second inverter includes a gated inverter coupled to said clock circuitry, such that said first latch latches said first signal in response to said second transition.

18. The circuitry of claim 13 wherein said second latch is coupled to said clock circuitry and latches said second signal in response to said first transition.

19. The circuitry of claim 13 wherein said multiplexer includes:
   a driver section for controlling said output signal to indicate said logic state of said first signal in response to said second transition; and
   a holder section for controlling said output signal to indicate said logic state of said second signal in response to said first transition.

20. The circuitry of claim 19 wherein said clock circuitry is operable to output an inverted clock signal inverted from said clock signal, and wherein said driver section includes:
   a first p-channel field effect transistor having a gate coupled to said first latch, a source coupled to a voltage supply node, and a drain;
   a second p-channel field effect transistor having a gate coupled to said clock circuitry for receiving said inverted clock signal, a source coupled to said drain of said first p-channel field effect transistor, and a drain coupled to a first output node;
   a first n-channel field effect transistor having a gate coupled to said gate of said first p-channel field effect transistor, a source coupled to a voltage reference node, and a drain; and
   a second n-channel field effect transistor having a gate coupled to said clock circuitry for receiving said clock signal, a source coupled to said drain of said first n-channel field effect transistor, and a drain coupled to said first output node.

21. The circuitry of claim 20 wherein said holder section includes:
   a third p-channel field effect transistor having a gate coupled to said second latch, a source coupled to said voltage supply node, and a drain;
   a fourth p-channel field effect transistor having a gate coupled to said clock circuitry for receiving said clock signal, a source coupled to said drain of said third p-channel field effect transistor, and a drain coupled to a second output node;
   a third n-channel field effect transistor having a gate coupled to said gate of said third p-channel field effect transistor, a source coupled to said voltage reference node, and a drain; and
   a fourth n-channel field effect transistor having a gate coupled to said clock circuitry for receiving said inverted clock signal, a source coupled to said drain of said third n-channel field effect transistor, and a drain coupled to said second output node.

22. The circuitry of claim 21 wherein said first output node is coupled to said second output node for outputting said output signal.

23. The circuitry of claim 13 wherein said first transition is a positive edge transition of said clock signal, and said second transition is a negative edge transition of said clock signal.

24. The circuitry of claim 13 wherein said first transition is a negative edge transition of said clock signal, and said second transition is a positive edge transition of said clock signal.

25. A method of latching a logic state, comprising the steps of:
   outputting a first signal indicating a logic state of an input signal in response to a first transition of a clock signal;

outputting a second signal indicating a logic state of said first signal in response to a second transition of said clock signal; and outputting an output signal indicating said logic state of said first signal in response to said second transition and indicating a logic state of said second signal in response to said first transition.

26. The method of claim 25 and including the step of latching said first signal.

27. The method of claim 26 wherein said step of latching said first signal includes the step of latching said first signal in response to said second transition.

28. The method of claim 27 and including the step of latching said second signal.

29. The method of claim 28 wherein said step of latching said second signal includes the step of latching said second signal in response to said first transition.

30. The method of claim 25 wherein said step of outputting said second signal indicating said logic state of said first signal includes the step of outputting said second signal having a logic state inverted from that of said first signal.

31. The method of claim 25 wherein said step of outputting said first signal indicating said logic state of said input signal includes the step of outputting said first signal having a logic state equal to that of said input signal.

32. Circuitry for latching a logic state, comprising:
an input node for inputting an input signal;
transfer circuitry coupled to the input node for outputting a first signal indicating a logic state of said input signal in response to a first transition of a reference signal and for outputting a second signal indicating a logic state of the first signal in response to a second transition of the reference signal; and
circuitry coupled to the transfer circuitry for outputting an output signal indicating the logic state of the first signal in response to the second transition and indicating a logic state of the second signal in response to the first transition.

33. The circuitry for latching a logic state of claim 32, wherein said reference signal is a clock signal.

* * * * *